United States Patent [19]

Kato

[11] Patent Number: 5,051,865
[45] Date of Patent: Sep. 24, 1991

[54] MULTI-LAYER SEMICONDUCTOR DEVICE

[75] Inventor: Takashi Kato, Sagamihara, Japan

[73] Assignee: Fujitsu Limited, Kawasaka, Japan

[21] Appl. No.: 667,257

[22] Filed: Mar. 11, 1991

Related U.S. Application Data

[63] Continuation of Ser. No. 443,070, Nov. 30, 1989, abandoned, which is a continuation of Ser. No. 222,341, Jul. 20, 1988, abandoned, which is a continuation of Ser. No. 874,852, Jun. 16, 1986, abandoned.

[30] Foreign Application Priority Data

Jun. 17, 1985 [JP] Japan ................................ 60-131009

[51] Int. Cl.⁵ ............................................ H01L 23/34
[52] U.S. Cl. .................................... 361/386; 357/75; 357/81
[58] Field of Search ............... 361/383, 384, 386, 388, 361/394, 414, 396; 357/75, 76, 74, 81, 82; 174/16.3, 52.4

[56] References Cited

U.S. PATENT DOCUMENTS

| | | | |
|---|---|---|---|
| 3,243,660 | 3/1966 | Yuska et al. | 361/386 |
| 3,704,455 | 11/1972 | Scarbrough . | |
| 3,705,332 | 12/1972 | Parks | 357/75 |
| 4,283,754 | 8/1981 | Parks . | |
| 4,500,905 | 2/1985 | Shibata | 357/56 |
| 4,514,784 | 4/1985 | Williams et al. | 361/396 |
| 4,546,406 | 10/1985 | Spinelli et al. | 361/386 |
| 4,628,407 | 12/1986 | August et al. | 361/386 |
| 4,698,662 | 10/1987 | Young et al. | 174/16.3 |

FOREIGN PATENT DOCUMENTS

| | | | |
|---|---|---|---|
| 1599169 | 8/1970 | France . | |
| 2124319 | 9/1972 | France . | |
| 56191096 | 5/1983 | Japan | 357/81 |
| 61-18164 | 1/1986 | Japan | 357/81 |
| 1083200 | 9/1967 | United Kingdom . | |
| 1212279 | 11/1970 | United Kingdom . | |

OTHER PUBLICATIONS

IBM Technical Disclosure Bulletin vol. 23, No. 11, Apr. 1981, p. 4835 "Stacked Thermally Enhanced High Package Density Module", Marks.
PCT International Publication No. WO 85/02283, PCT/US83/01750.
Patent Abstracts of Japan, vol. 10, No. 168 (E-411) [2224], Jun. 14, 1986 & JP-A-61 18 164 (Mitsubishi Denki K.K.) 27-01-1986.

Primary Examiner—Howard L. Williams
Attorney, Agent, or Firm—Staas & Halsey

[57] ABSTRACT

A multi-layer semiconductor device which includes a stacked wafer body having a plurality of sets of two semiconductor wafers and a heat sink plate interposed therebetween. An end of the heat sink plate of each set of wafers is exposed at at least one of the side surfaces of the stacked wafer body.

An intermediate connecting circuit is provided for connecting circuits in each of the sets of two semiconductors wafers, the intermediate connecting circuit is provided on at least one side surface other than the surface at which the ends of the heat sink plate are exposed.

8 Claims, 13 Drawing Sheets

MULTI-LAYER SEMICONDUCTOR DEVICE

This application is a continuation of application Ser. No. 07/443,070, filed Nov. 30, 1989, which is a continuation of Ser. No. 222,341, filed July 20, 1988, and which is a continuation of Ser. No. 874,852, filed June 16, 1986 now abandoned.

BACKGROUND OF THE INVENTION

1. Field of the Invention

The present invention relates to a multi-layer semiconductor device, more particularly, it relates to a multi-layer semiconductor device having a heat sink.

2. Description of the Related Art

To improve the integration density of an integrated circuit, consideration has been given to the use of a planar integration density and a packaging technique therefor. Particularly, to improve the integration density, a mutualization of patterns has been carried out.

However, these considerations are self-evidently limited from the viewpoint of miniaturization of the integrated circuit.

Under this background, the present inventor filed Japanese Patent Application No. 59-60943, wherein integrated circuit chips are stacked to produce a stacked chip type multi-layer semiconductor device. The height of this structure of the multi-layer semiconductor device is decreased, and thus the integrated density is improved.

In such a structure of the multi-layer semiconductor device, however, the exotherm per unit volume is increased, which results in overheating, and thus it is relatively easy for a power-transistor having a high electrical heat element to be formed in the structure.

Moreover, since a heat sink metal plate is provided between stacked IC chips, electrical interconnection between each IC chip using a bump is difficult.

SUMMARY OF THE INVENTION

It is an object of the present invention to provide a multi-layer semiconductor device having an improved heat dissipation efficiency.

Therefore, according to the present invention, there is provided a multi-layer semiconductor device comprising: a stacked wafer body consisting of a plurality of sets of two semiconductor wafers and heat sink plates interposed therebetween, an end of the heat sink plate for each set of wafers being exposed at at least one of the side surfaces of the stacked wafer body.

An intermediate connecting circuit is provided for connecting circuits in each of the sets of wafers. The intermediate connecting circuit is provided on at least one side surface other than the surface at which the ends of the heat sink plates are exposed.

DESCRIPTION OF THE PREFERRED EMBODIMENTS

Before describing the preferred embodiments of the present invention, an explanation will be given of the related art.

Figure 1:
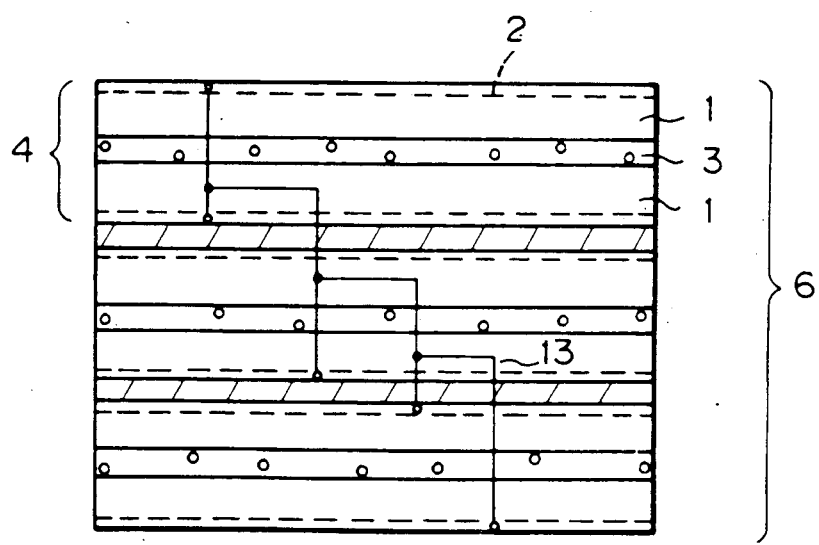
FIG. 1 is a cross-sectional view of a prior multi-layer semiconductor device.

FIG. 1 shows a cross-sectional view of a prior multi-layer semiconductor device which the present inventor proposed before. As shown in FIG. 1, a set 4 of integrated circuits consisting of semiconductor wafers 1 facing each other through a metal plate 3 are stacked in three layers. On the semiconductor wafer 1, a plurality of semiconductor elements 2 and wirings are formed to constitute a plurality of integrated circuits. In the stacked-wafer structure 6, in which sets of multi-layer integrated circuits are formed, electrode wirings 13 are formed between circuits included in respective layers of the semiconductor device chips. In such a structure of the multi-layer semiconductor device, the height thereof is remarkably reduced, and the integrated density of the device can be accordingly improved.

But, when the semiconductor chips are formed, the exotherm per unit volume is increased during the operation thereof, and a problem of overheating occurs. Further, since only wiring was formed on a side surface, additional circuits for controlling electric signals between IC chips of each semiconductor device must be formed in inside respective IC chips or additional IC chips consist only of controlling circuits. Thus response of a three dimensional signal is delayed. Additionally, the efficiency of the wiring process on a side surface is greatly decreased.

Figure 2A:
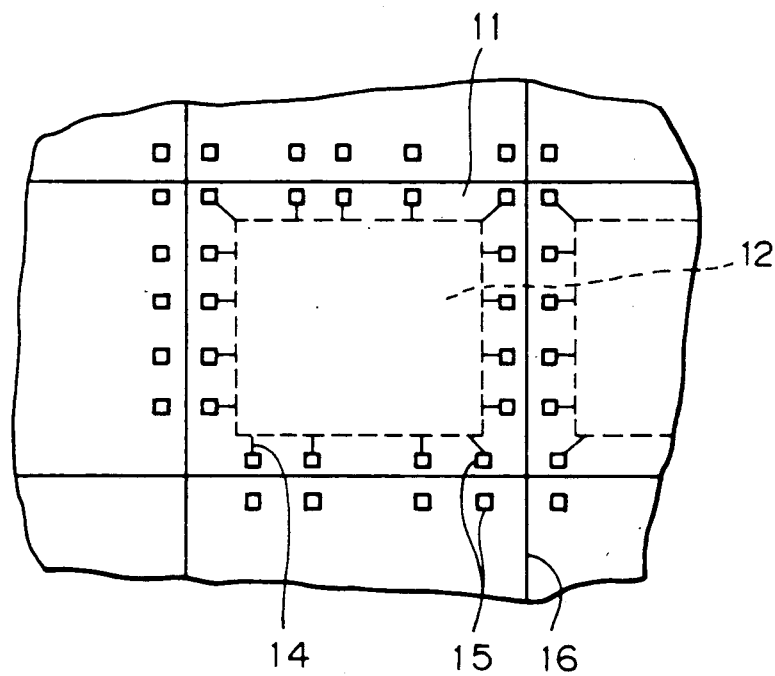
FIG. 2A is a view of conventional IC chips.

FIG. 2A shows many similar IC chips 11 formed on a wafer, wherein the IC chips 11 have been separated from each other by cutting the slice line 16 of the wafer, and as also shown in FIG. 2A, an IC element forming the region 12 is connected to pad electrodes 15 through aluminum wiring 14.

The electrodes 15 are formed by wire bonding to the pad electrodes 15.

Figure 2B:
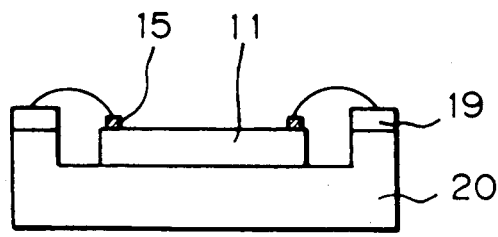
FIG. 2B is a cross-sectional view of FIG. 2A.

FIG. 2B shows a cross-sectional view of FIG. 2A. In FIG. 2B, 19 and 20 denote a lead-frame and ceramic, respectively.

Figure 3:
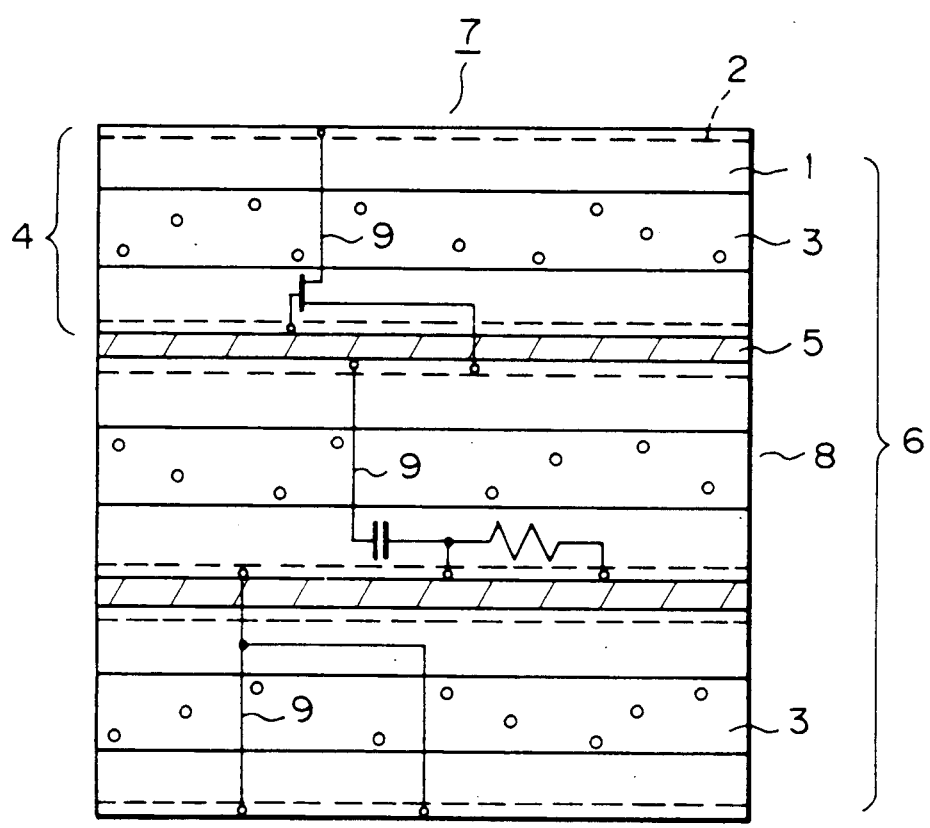
FIG. 3 is a side view of a device according to the present invention.

FIG. 3 shows a side view of a device according to the present invention.

FIG. 3 shows a wafer set 4 of two silicon wafers 1 and a heat sink plate 3 interposed therebetween. The heat sink plate is made of, for example, aluminum and copper.

The sets 4 are stacked in a wafer stacked body 6, and the ends of the heat sink plate 3 are exposed.

Intermediate connecting circuits connecting and controlling the semiconductor elements 2 are provided on a surface of a multi-layer semiconductor IC chip 7. Transistors, capacitors, resistance, etc., are formed on a polished side surface of a semiconductor wafer together with wirings. The semiconductor wafers 1 are connected through an insulating layer 5.

A method for producing a structure of the present invention will now be explained.

Figure 4:
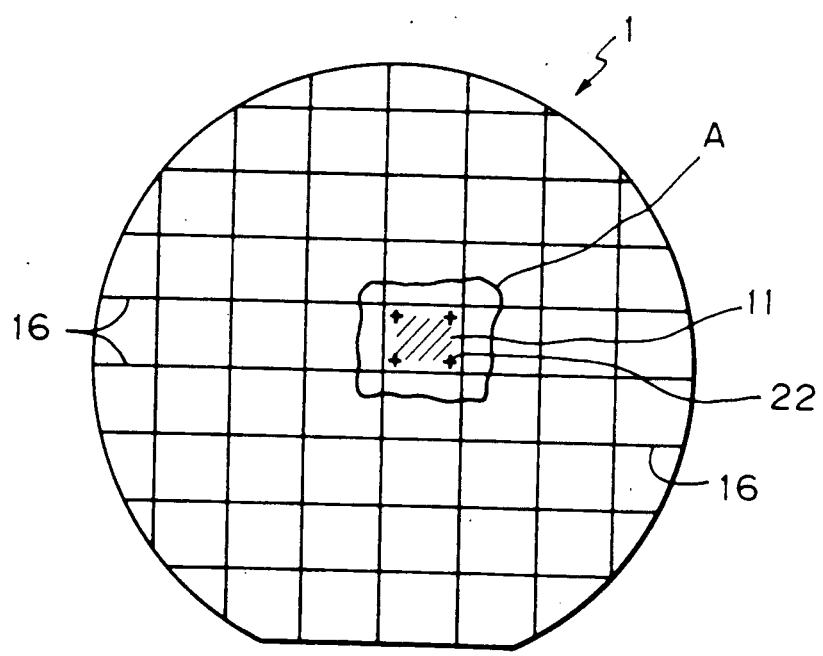
FIG. 4 is a view of IC chips in a silicon wafer.

As shown in FIG. 4, semiconductor elements are formed on a (100) surface of a silicon wafer 1, and IC chips is 11 (only one chip shown) are formed on a suitable position so that side surface circuits can be formed together in a post process. In the figure, the lines 16 denote the slice lines. Alignment marks 22 are provided on the IC chip 11.

Figure 5:
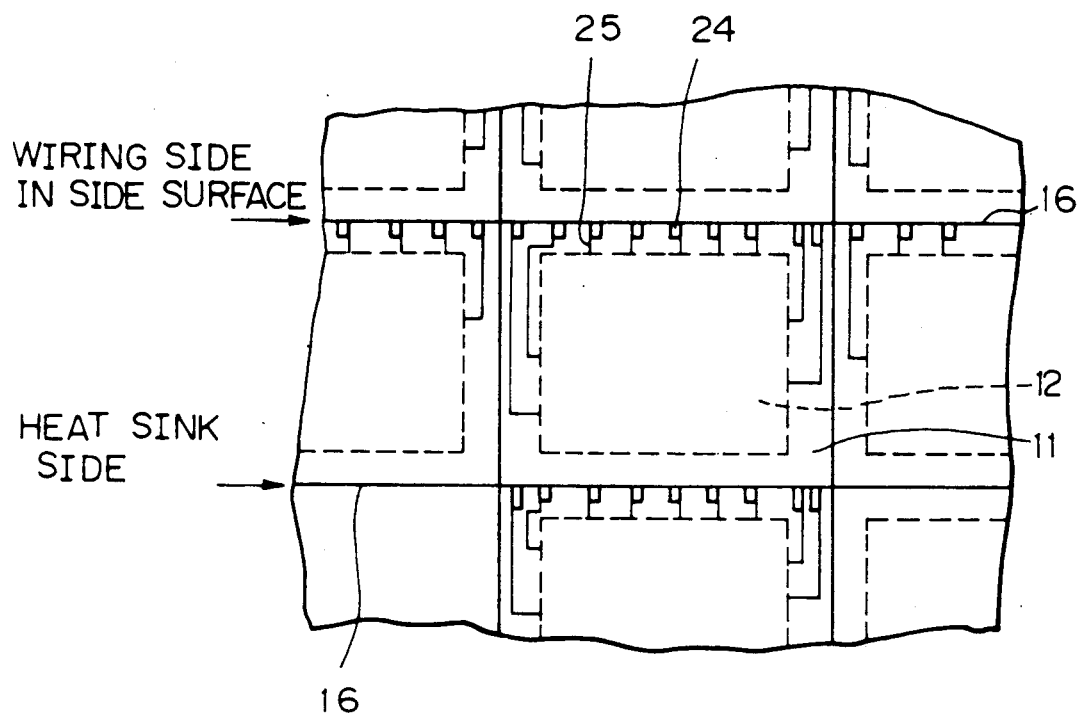
FIG. 5 is an enlarged view of a portion A of FIG. 4.

FIG. 5 is an enlarged view of a portion A of FIG. 4.

The electrical connections between the stacked IC chips in the present invention are carried out on a side surface of an IC chip. Thus, as shown in FIG. 5 the output electrodes drawn from the integrated elements are embedded in a slice surface.

Aluminum lead wiring is formed at the same time as the aluminum wiring is finally formed during the formation of the integrated semiconductor element region 12.

The aluminum lead wiring is connected to the embedded electrodes 24 formed along the slice lines 16. This aluminum wiring 25 is formed by a process wherein a 1 μm thick aluminum layer is formed by a sputtering process and patterned. The embedded electrodes 24 are 20 μm in width and 100 μm in length. After the formation of the electrode, a usual passivation film is formed.

Figure 6:
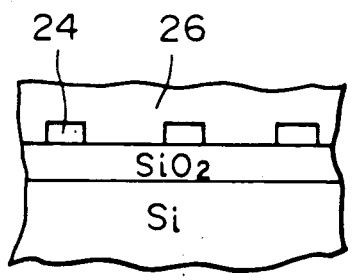
FIG. 6 is a schematic cross-sectional view taken along a slice line of FIG. 5.

FIG. 6 is a schematic cross-sectional view taken along a slice line of FIG. 5. As shown in FIG. 6 on the output electrodes 24, a passivation layer 26 is provided. A method for producing a base unit structure including an aluminum plate and silicon wafers connected through the aluminum plate will now be described.

Figure 7:
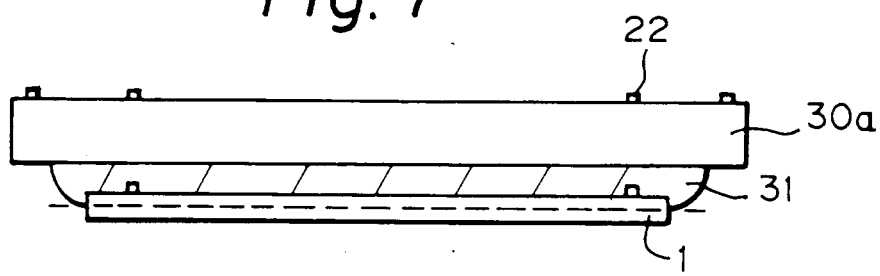
FIGS. 7 to 9 and FIG. 11 are views explaining a method for producing a stacked structure as a base unit structure.

As shown in FIG. 7, an IC side surface of a silicon wafer 1 is adhered to a supporting quartz plate 30a by a thermoplastic resin 31 such as picene. A back, non-adhered surface of the silicon wafer 1 is polished for reducing thickness to a total thickness of 200 μm.

Figure 8:
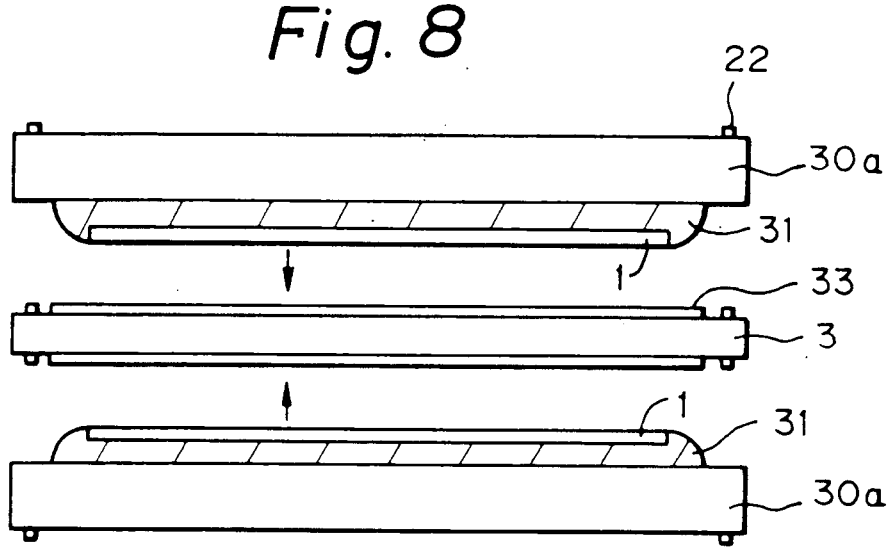

The supporting quartz plate 30a is aligned with the silicon wafer by an alignment mark 22. Another is formed, and, as shown in FIG. 8, the two structures are permanently bonded to an aluminum plate 3 having a thickness of, for example, 0.05 to 1 mm, by silver paste or Au-Sn solder 33.

Then, the thermoplastic resin is heated and melted and the quartz plates 30a on both sides are separated from the silicon wafers 1 so that a base unit structure including a heat sink aluminum plate 3 and silicon wafers 33 is formed.

After formation, the base unit structure is cleaned by trichlene.

Figure 9:
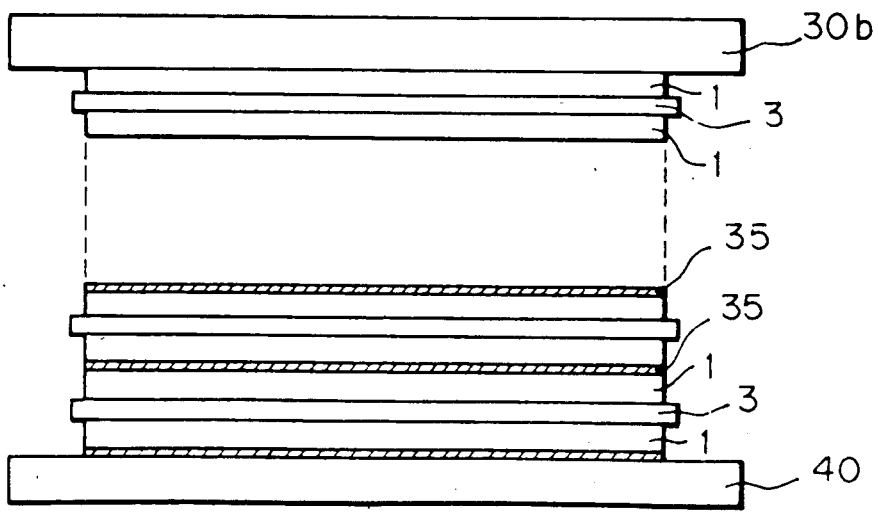

Then, one base unit structure is connected to another base unit structure by a silicone resin. One of the base unit structures is fixed to a quartz plate 30b by vacuum chucking, and the other base unit structure is permanently bonded to a ceramic substrate 40 by a silicone resin such as PLOS (polyladder organosiloxane). Thus, the base unit structures are stacked as shown in FIG. 9.

When the consumption of electric power per one IC chip is assumed to be 0.5 watt, the IC chip can be cooled enough by an aluminum plate having a thickness of 70 μm.

The thickness of the cooling metal plate can be calculated. In cooling the metal plate the thermal resistance is described by a following expression:

$$R = \frac{1}{K} \cdot \frac{1}{s} \quad (°c/w) \tag{1}$$

R: thermal resistance of the metal plate,
K: thermal conductivity of the metal plate,
l: length of the metal plate,
s: cross-sectional area of the metal plate (in a direction of thermal flow),
d: thickness of the metal plate,
x: width of the metal plate,
Thermal resistance of the basic structure of the present invention wherein an IC chip is adhered to both sides of the metal plate will be calculated.

Figure 10A:
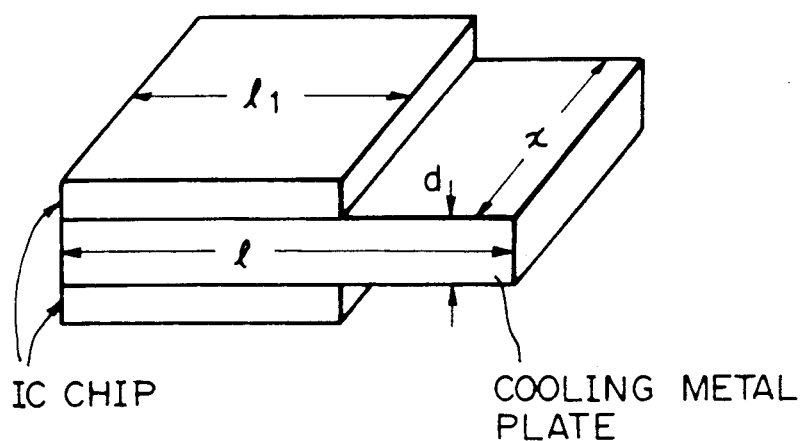
FIG. 10A is a view of an example for explaining thermal resistance.
Figure 10B:
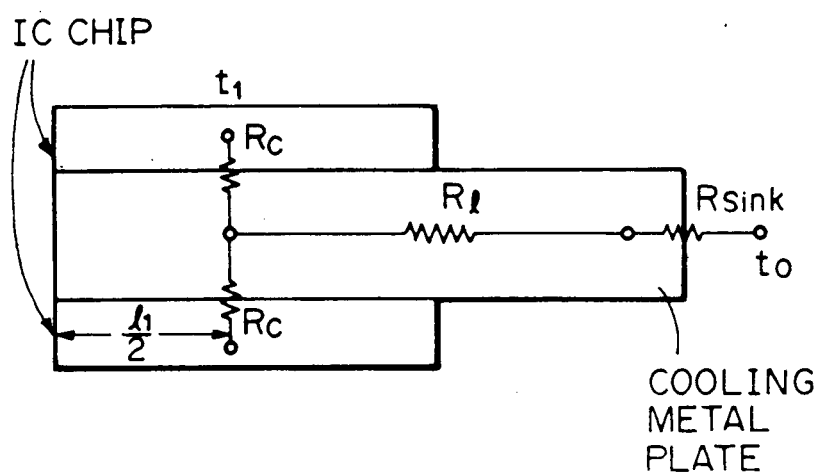
FIG. 10B is a thermal equivalent circuit diagram of FIG. 10A.

FIG. 10A is an example for explaining thermal resistance and FIG. 10B is an equivalence thermal circuit diagram of FIG. 10A.

In FIG. 10B, $R_c$, $R_e$ and $R_{sink}$ are a contact thermal resistance between an IC chip and a metal plate, an average thermal resistance of a metal plate and contact thermal resistance with a heat sink, respectively.

Thermal resistance R of one of both IC chips opposed through the metal plate is the total of $R_c$, $R_e$ and $R_{sink}$. Namely, $R = R_c + R_e + R_{sink}$. In this case, the length of the cooling metal plate is shown by:

$$l - \frac{l_1}{2}.$$

When a temperature of the IC chip is $t_1$ and a temperature of the heat sink is equal to the permissible quantity of heat, P is obtained by the following expression:

$$P = (t_1 - t_0)/R \tag{2}$$

Since the thermal resistance $R_c$ and $R_{sink}$ are small such as 0.1 (°C/W) and 0.01~0.1 (°C/W) respectively when solder is used to adhere, the total thermal resistance R is substantially shown as $R_e$.

When an IC chip size is assumed to be 1 cm × 1 cm resistance in a longitudinal direction shown in FIG. 10B can be neglected and a thermal resistance of the cooling metal plate is represented only by to the length of $$l - \frac{l_1}{2}$$

from the center of the IC chip.

Thus, from the expression (1)

$$R = \frac{1}{K} \cdot \frac{1 - \frac{l_1}{2}}{x \cdot d}$$

This expression is substituted in the above expression (2) to obtain:

$$P = \frac{(t_1 - t_0)K - d}{1 - \frac{l_1}{2}} \cdot d$$

When the following practical numerical values are substituted, and the cooling metal plate is aluminum, then the following results:

$t_1 = 80°$ C., $t_0 = 20°$ C., $K = 2.37$ w/cm °C.

$x = l_1 = 1$ cm, $l = 1.5$ cm $$P = 60 \cdot K \cdot d = 142 \cdot d \, (w) \qquad (3)$$

When the cooling metal plate is copper, then:

$$P = 240 \cdot d(w) \qquad (4)$$

In a bipolar IC having a large power consumption, maximum heat capacity is 10 W.

Thus when in the expressions (3) and (4) P is 10, the thickness (d) of the aluminum and copper cooling plates are 0.07 and 0.042 cm, respectively.

However, when two IC chips are adhered to a cooling metal plate according to the present invention twice the thickness of the cooling metal plate (i.e. 0.14 cm for Al, 0.084 cm for Cu) is necessary.

Judging from only the cooling effect, copper is advantageous. However aluminum is practically used in view of workability, weight, cost, etc.

In this example an aluminum plate having a thickness of 0.5 mm is used. Consequently, the total thickness of the two IC chips and the aluminum plate is about 1 mm. Since a 20×20 mm chip is formed on the 6 inch silicon wafer, it is better that twenty base unit structures are stacked to form a three-dimensional IC cubic unit. Furthermore, to increase efficiency of the formation of the side surface wiring, it is best that one hundred basic units forming five layers of three-dimentional IC cubic units are stacked, whereby the production efficiency of the side surface wiring is increased five-fold. The width of the side surface of only 20 basic units is 20 mm. On the other hand, since a size of a mask to form side surface circuits is 150 mm or more five layers of the IC cubic unit must be formed so as not to make useless space.

Figure 11:
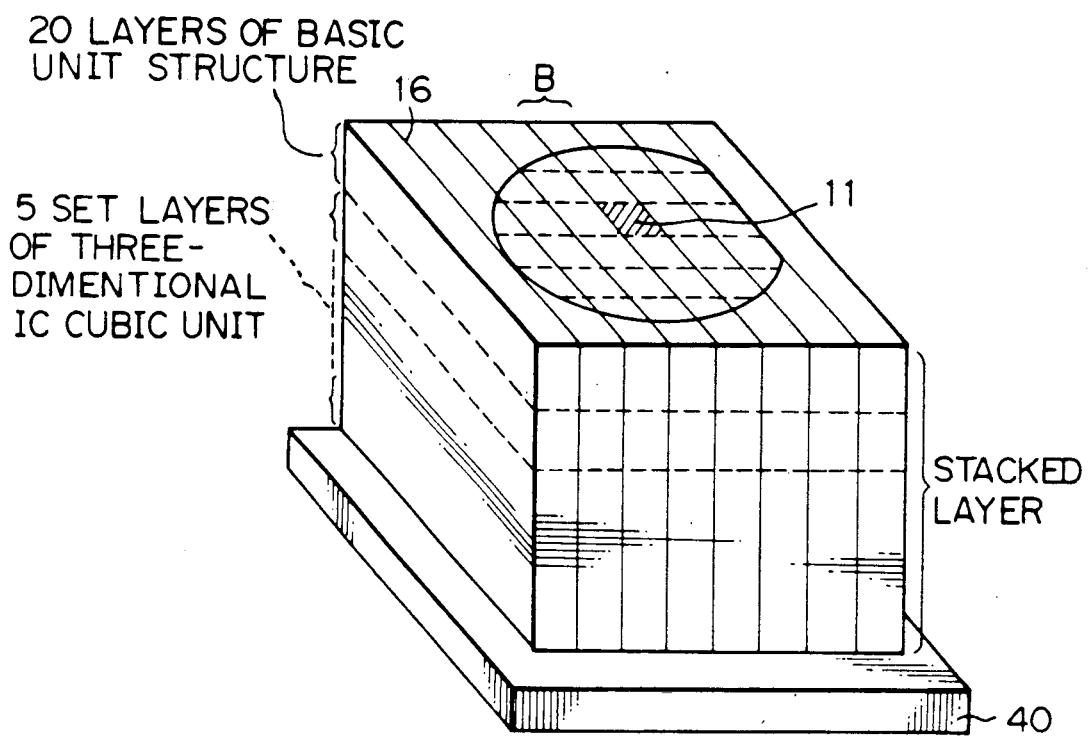

The stacked structure is shown in FIG. 11. When the structure is vertically sliced at a spacing of 20 mm, a slice B shown in FIG. 12 and FIG. 11 is obtained.

In this case, the sliced surfaces should be polished to a mirror surface in which an embedded electrode has been previously exposed.

When 20 layers of a basic unit structure are stacked 20×20×20 mm IC cubic units of the same number of IC chips formed on a wafer can be produced. In FIG. 11, five set of 20 layers of the basic unit structure are stacked. The feature of the present invention resides in that after stacking a lot of the IC cubic units, slices are produced and side surface circuits can be collectively formed using one mask by well known process. As shown in FIG. 12, the heat sink side is the back side of the wiring side.

Figure 12:
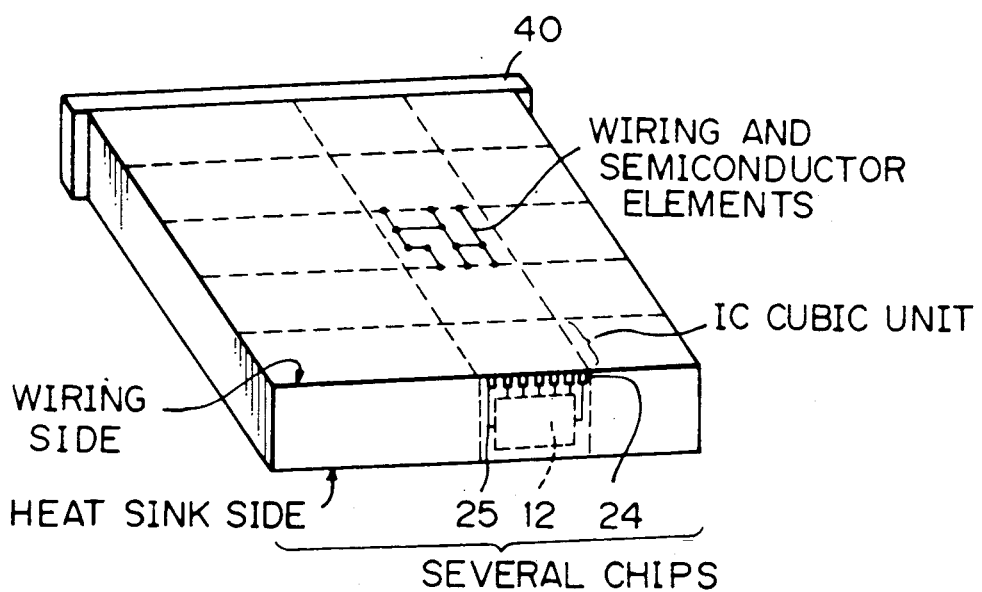
FIG. 12 is a view of a slice B in FIG. 11.
Figure 13:
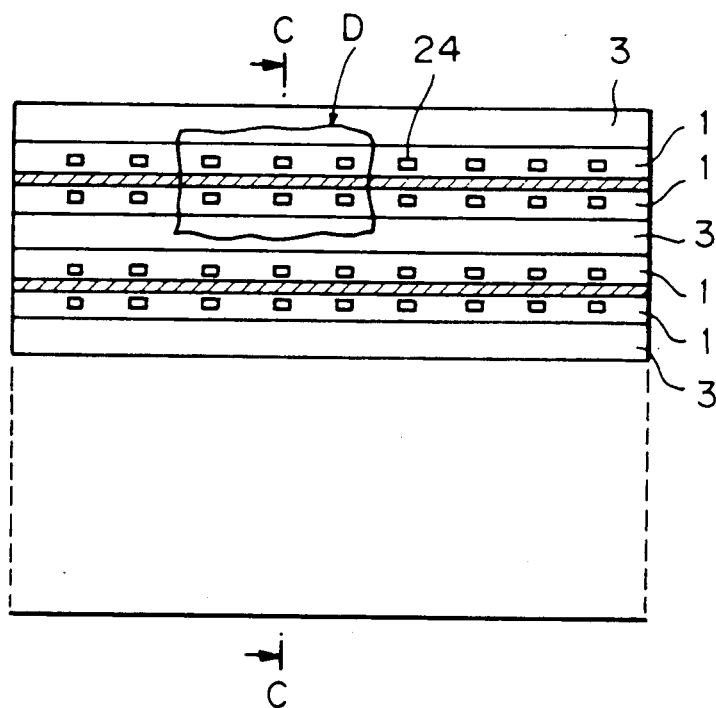
FIG. 13 is an enlarged view of a sliced portion of FIG. 12.
Figure 14:
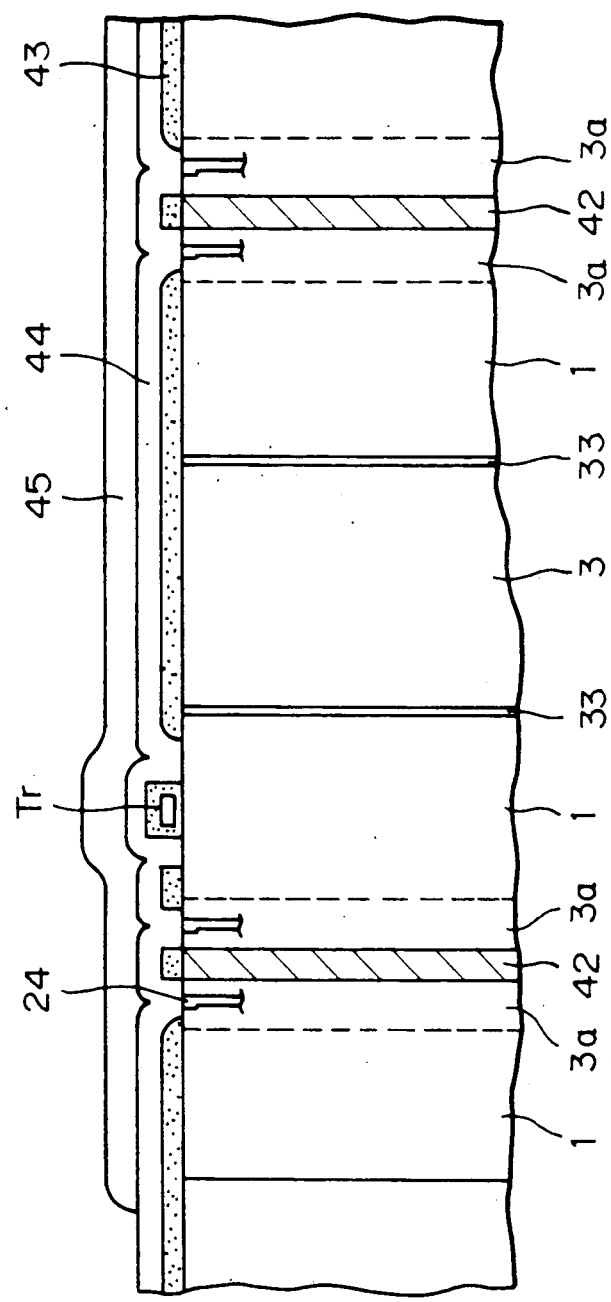
FIG. 14 is a cross-sectional view taken along a line C—C of FIG. 13.

FIG. 13 shows an enlarged view of a polished wiring side portion of FIG. 12, and FIG. 14 shows a cross-sectional view thereof taken along a line C—C of FIG. 13.

In FIG. 14, the aluminum plates 3, silicon wafers 1, device formation layer 3a, adhesive 33 and embedded electrodes 24 are exposed.

Figure 15:
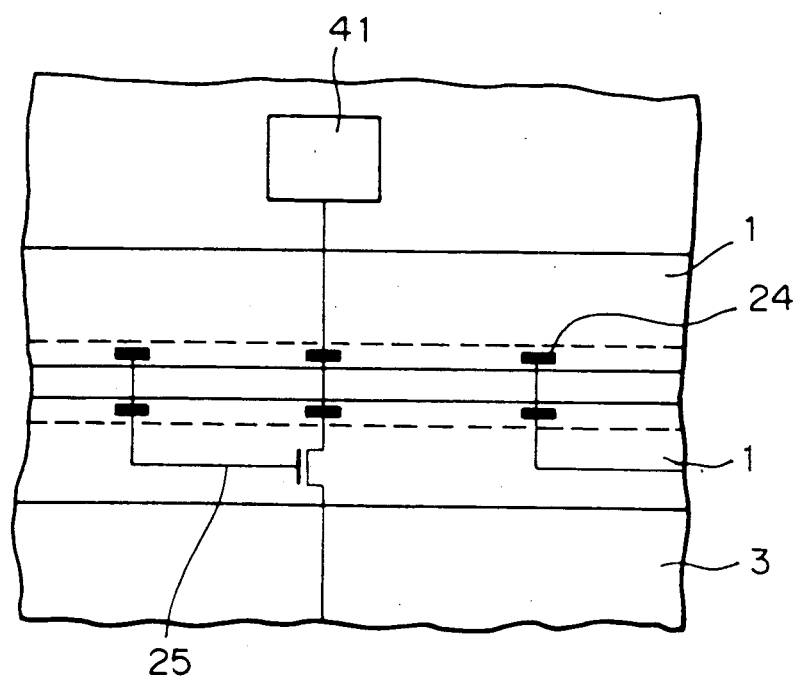
FIG. 15 is an enlarged view of a portion D of FIG. 13.

To form a transistor and connect the embedded electrodes 24 to each other on the silicon wafer 1, a 5000 Å thick $SiO_2$ layer 43 is first formed on the entire silicon wafer by a well known chemical vapour deposition (CVD) process. Then, after, for example, $SiO_2$ of a transistor formation region is removed, a gate oxide film is formed by laser oxidation, a tungstensilicide gate metal is formed, and a source and a drain are formed by ion-implanting and laser annealing processes, so that a MOS transistor is formed. After the formation of the layer insulating film in the transistor region, and the required portion of the embedded electrode is opened, aluminum 44 is deposited to a thickness of 1 μm by a sputtering process, the aluminum is patterned, and a passivation film 45 is formed thereon, so that a side surface IC is completed. Consequently, the circuits shown in FIG. 15 are formed on the side surface of the sliced structure. FIG. 15 is an enlarged view of the portion D in FIG. 13.

In FIG. 15, 41 and 25 denote an aluminum bonding pad and an aluminum wiring, respectively.

Next, the heat sink side is formed.

First, the silicone resin adhesive layer is etched by oxygen plasma and a silicon substrate is etched selectively by a mixed etchant including $HClO_4$ and $H_3PO_4$, so that an aluminum plate having an end extended for 1 μm can be obtained. As shown in FIG. 11, since in the heat sink side embedded electrodes 24 are not formed, problems do not occur in the etching process.

The etching is simultaneously carried out in all IC cubic units included in the slice of FIG. 11.

Figure 16:
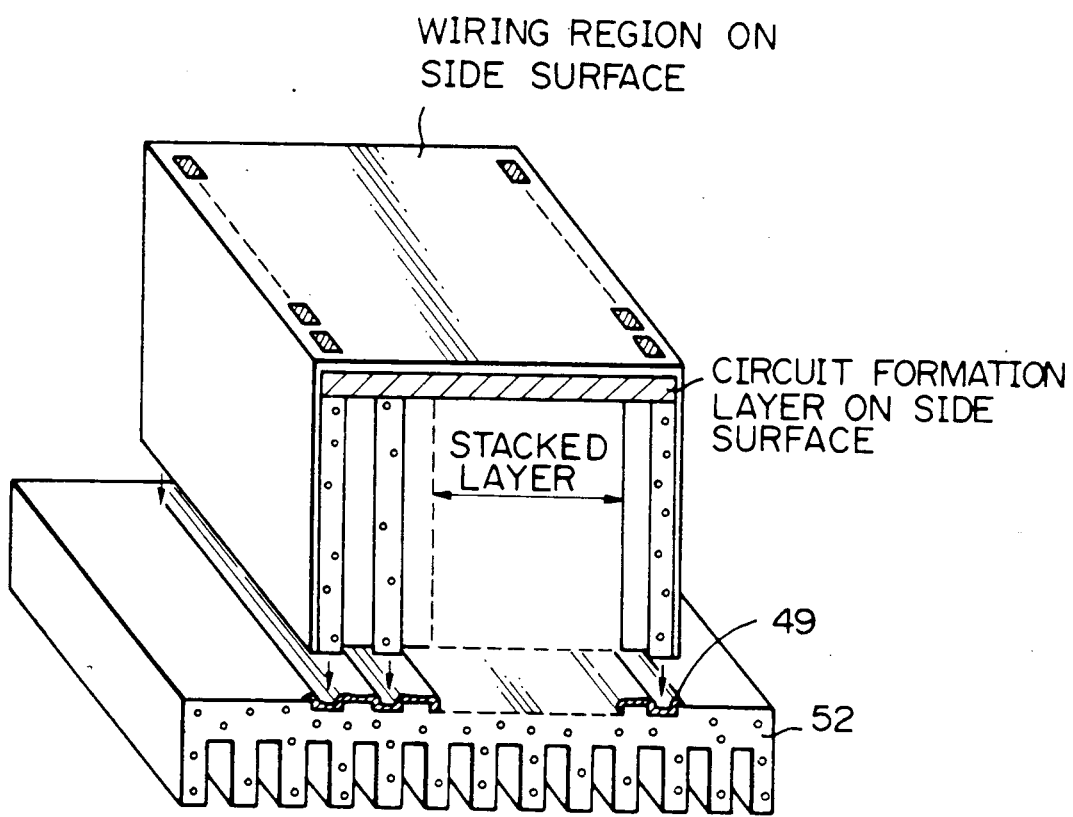
FIGS. 16 and 17 are perspective views of an example of the present invention having a heat sink with grooves and fins; and, FIG. 18 is a view of another example of the present invention.

Thus, a slice shown in FIG. 12 is further cut to a three-dimensional IC cubic unit (20×20×20 mm), a surface other than a heat sink surface is covered by a polyimide, and a pad aluminum electrode is opened so that a structure shown in FIG. 16 is obtained. In FIG. 16, 52 is an aluminum heat sink having dissipating fins.

Grooves to be fixed to the extended aluminum plate by solder 49 are provided on a surface of the aluminum heat sink 52.

Figure 17:
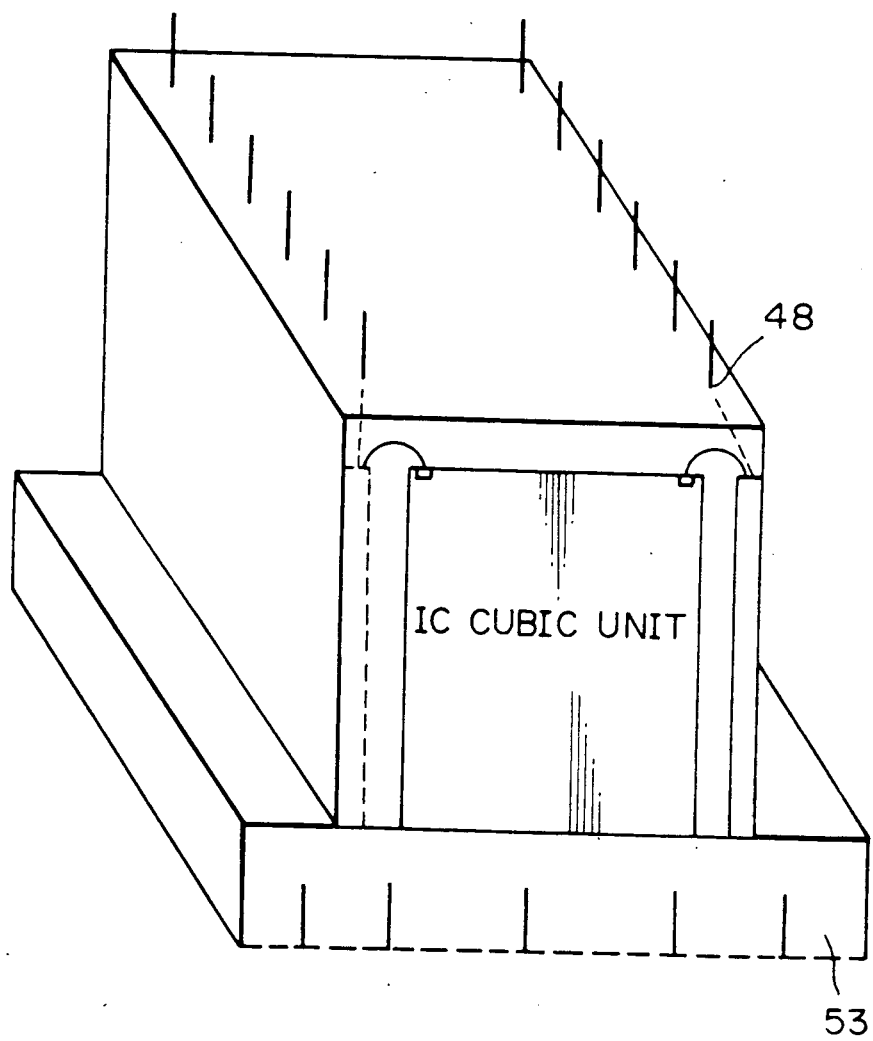

FIG. 17 shows a structure of a three-dimensional IC package according to the example of the present invention.

Figure 18:
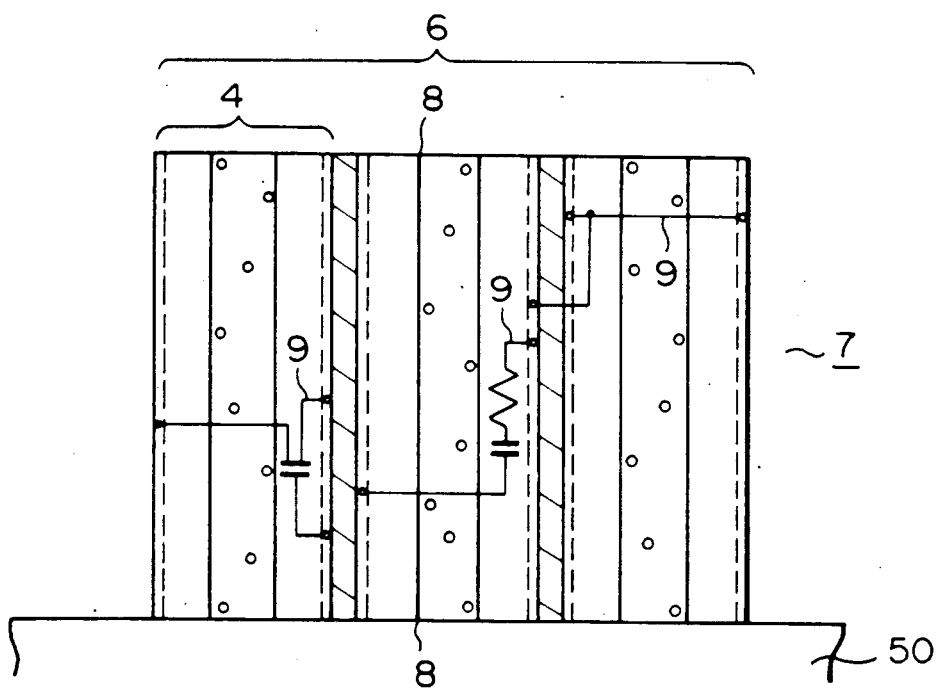

FIG. 18 shows another example of the present invention.

As shown in FIG. 18 a structure having a flat heat sink side surface wherein a multi-layer semiconductor IC chip 7 is formed and adhered to a large heat sink plate 50 with solder. In FIG. 18, an intermediate connecting circuit 9 is provided on a surface of the structure. Accordingly, as aluminum plates for dissipation are connected to the large heat sink plate, the heat sink effects during operation are improved.

I claim:
1. A multi-layer semiconductor device comprising:
  a stacked wafer body having polished vertically sliced side surfaces, including:
  a plurality of sets of two semiconductor wafers having an integrated element formed on each of said semiconductor wafers;
  an insulating layer formed on said semiconductor wafer;
  transistors directly formed on exposed semiconductor wafers in one of the polished vertically sliced side surfaces of said stacked wafer body for controlling the response of said integrated element on each of said semiconductor wafers; and
  a plurality of heat sink plates formed between and contacting said sets of two semiconductor wafers, one back side of each of said semiconductor wafers being formed on and having its entire surface in contact with said heat sink plates, an element-formed side of each of said semiconductor wafers having said insulating layer formed thereon, an end of said heat sink plate of each of said sets of two semiconductor wafers being exposed and projecting from at least one of said surfaces of said stacked wafer body; and an intermediate connecting circuit, connected to said stacked wafer body, for connecting circuits in each of said sets or two semiconductor wafers, said intermediate connecting circuit being provided on at least one side surface other than the surface at which the ends of said heat sink plates are exposed.

2. A multi-layer semiconductor device according to claim 1, wherein said heat sink plate comprises one of aluminum and copper.

3. A multi-layer semiconductor device according to claim 2, wherein the thickness of said aluminum heat sink plate is approximately 70 $\mu$m or more, and wherein the thickness of said copper heat sink plate is approximately 42 $\mu$m or more.

4. A multi-layer semiconductor device according to claim 1, further including a heat sink, wherein said heat sink plates have exposed ends, and wherein said exposed ends of said heat sink plates are connected to said heat sink.

5. A multi-layer semiconductor device according to claim 4, wherein said heat sink plates have extended ends, wherein said heat sink has grooves formed therein, and wherein said connection of said exposed ends of said heat sink plates to said heat sink is carried out by connecting said extended ends of said heat sink plates to said grooves of said heat sink.

6. A multi-layer semiconductor device according to claim 4, wherein the exposed ends of said heat sink plates are fixed at right angles to said heat sink plates, wherein said intermediate connecting circuit being further provided on an opposite side surface from said side surface from which the ends of said heat sink plates project and further includes bonding pads, and wherein said semiconductor device is assembled in a three-dimensional IC package.

7. A multi-layer semiconductor device according to claim 1, wherein one of the side surfaces from which the end of said heat sink plate projects is the back side of the other side surface on which said intermediate connecting circuit is formed.

8. A multi-layer semiconductor device according to claim 7, wherein said intermediate connecting circuit has electrodes embedded in said semiconductor wafers.

* * * * *

UNITED STATES PATENT AND TRADEMARK OFFICE
CERTIFICATE OF CORRECTION

PATENT NO. : 5,051,865
DATED : SEPTEMBER 24, 1991
INVENTOR(S) : TAKASHI KATO

It is certified that error appears in the above-identified patent and that said Letters Patent is hereby corrected as shown below:

TITLE PAGE [73] Assignee: "Kawasaka," should be --Kawasaki,--.

Col. 2, line 47, "in" should be deleted.

Col. 3, line 14, "chip shown)" should be --chip is shown)--;
line 48, "another is" should be --another structure, the same as above, is--.

Col. 5, line 51, "set" should be --sets--.

Col. 6, line 2, "tungstensilicide" should be --tungsten silicide--.

Signed and Sealed this

Twelfth Day of January, 1993

Attest:

DOUGLAS B. COMER

Attesting Officer     Acting Commissioner of Patents and Trademarks